US008514602B2

(12) United States Patent
Noda

(10) Patent No.: US 8,514,602 B2
(45) Date of Patent: Aug. 20, 2013

(54) NONVOLATILE SEMICONDUCTOR MEMORY DEVICE

(75) Inventor: Mitsuhiko Noda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 389 days.

(21) Appl. No.: 13/017,367

(22) Filed: Jan. 31, 2011

(65) Prior Publication Data
US 2011/0194349 A1 Aug. 11, 2011

(30) Foreign Application Priority Data

Feb. 8, 2010 (JP) .................................. 2010-025298
Nov. 26, 2010 (JP) .................................. 2010-263660

(51) Int. Cl.
*G11C 5/06* (2006.01)
*H01L 27/06* (2006.01)

(52) U.S. Cl.
USPC ................. 365/63; 365/51; 365/72; 257/506; 257/E27.013; 257/E27.014

(58) Field of Classification Search
USPC .................. 365/51, 63, 72, 185.05; 257/506, 257/524, E27.013, E27.014, E27.06
See application file for complete search history.

(56) References Cited

U.S. PATENT DOCUMENTS

| 5,958,075 | A | * | 9/1999 | Wendell | 714/726 |
| 6,046,940 | A | | 4/2000 | Takeuchi et al. | |
| 6,442,087 | B1 | * | 8/2002 | Morishima | 365/203 |
| 6,812,540 | B2 | * | 11/2004 | Takaura et al. | 257/510 |
| 6,925,008 | B2 | | 8/2005 | Ichige et al. | |
| 7,423,898 | B2 | * | 9/2008 | Tanizaki et al. | 365/148 |
| 7,508,692 | B2 | | 3/2009 | Anezaki et al. | |
| 2007/0208903 | A1 | | 9/2007 | Gomikawa et al. | |

FOREIGN PATENT DOCUMENTS

JP 2007-234878 9/2007

OTHER PUBLICATIONS

U.S. Appl. No. 13/224,504, filed Sep. 2, 2011, Suzuki, et al.

* cited by examiner

*Primary Examiner* — Allison P Bernstein
(74) *Attorney, Agent, or Firm* — Oblon, Spivak, McClelland, Maier & Neustadt, L.L.P.

(57) ABSTRACT

In one embodiment, a nonvolatile semiconductor memory device includes a substrate provided with a memory cell part and sense amplifiers on a surface of the substrate, first isolation regions and first device regions disposed in the substrate under the memory cell part, and second isolation regions and second device regions disposed in the substrate under the sense amplifiers. The device further includes a plurality of interconnects disposed on the substrate in the sense amplifiers, extending in a first direction parallel to the surface of the substrate, being adjacent to one another in a second direction perpendicular to the first direction, and arranged in the same interconnect layer. At least one of the second device regions includes first and second stripe portions extending in the first direction, being adjacent in the second direction, and having stripe shapes, and a connecting portion disposed to connect the first stripe portion and the second stripe portion. The device further includes a source contact disposed on the connecting portion, and electrically connected to one of the interconnects.

19 Claims, 12 Drawing Sheets

NONVOLATILE SEMICONDUCTOR MEMORY DEVICE

CROSS REFERENCE TO RELATED APPLICATIONS

This application is based upon and claims the benefit of priority from the prior Japanese Patent Applications No. 2010-25298, filed on Feb. 8, 2010 and No. 2010-263660, filed on Nov. 26, 2010, the entire contents of which are incorporated herein by reference.

FIELD

Embodiments described herein relate to a nonvolatile semiconductor memory device and are applied, for example, to active area (AA) portions in sense amplifiers.

BACKGROUND

In a nonvolatile semiconductor memory device including floating gates as charge storage layers, the memory cell size and the chip size can be shrunk by miniaturization techniques. As the memory cell size and the chip size become smaller in such a nonvolatile semiconductor memory device, peripheral circuit parts such as sense amplifiers become smaller in size. For example, in a case where the device region width (hereinafter also referred to as the "AA width") in a memory cell part is reduced, circuit devices such as transistors in the peripheral circuit parts are also made smaller, and the distance between these circuit devices is made shorter.

On the other hand, interconnect layers are disposed above the circuit devices on the peripheral circuit parts. To connect these circuit devices to one another, each interconnect layer includes a certain number or more of interconnects (interconnect patterns) in a certain area. However, when the AA width in the memory cell part is made smaller, it becomes to provide the interconnects at a higher density in the peripheral circuit parts, and therefore the distance between the interconnects in each interconnect layer becomes shorter. Due to this, there is a probability that short circuiting is generated between the interconnects in each interconnect layer. Therefore, a further reduction of the size of each peripheral circuit part is realized by reducing the number of interconnects placed on the peripheral circuit parts.

JP-A 2007-234878 (KOKAI) discloses an example of a planar shape and a sectional shape of a device region of a switching device, which is provided in a peripheral circuit part placed in the periphery of a memory cell part.

DETAILED DESCRIPTION

Embodiments will now be explained with reference to the accompanying drawings.

An embodiment described herein is, for example, a nonvolatile semiconductor memory device including a substrate provided with a memory cell part and sense amplifiers on a surface of the substrate, first isolation regions and first device regions disposed in the substrate under the memory cell part, and second isolation regions and second device regions disposed in the substrate under the sense amplifiers. The device further includes memory cell transistors placed in the memory cell part, each of which includes a tunnel insulator and a charge storage layer successively disposed on one of the first device regions, and peripheral transistors placed in the sense amplifiers, each of which includes a gate insulator and a gate electrode successively disposed on one of the second device regions. The device further includes a plurality of interconnects disposed on the substrate in the sense amplifiers, extending in a first direction parallel to the surface of the substrate, being adjacent to one another in a second direction perpendicular to the first direction, and arranged in the same interconnect layer. The device further includes a plurality of bit lines disposed on the substrate in the memory cell part, extending in the first direction, being adjacent to one another in the second direction, and electrically connecting the memory cell part and the sense amplifiers. At least one of the second device regions includes first and second stripe portions extending in the first direction, being adjacent in the second direction, and having stripe shapes, and a connecting portion disposed to connect the first stripe portion and the second stripe portion. The device further includes a source contact disposed on the connecting portion, and electrically connected to one of the interconnects.

Figure 1:
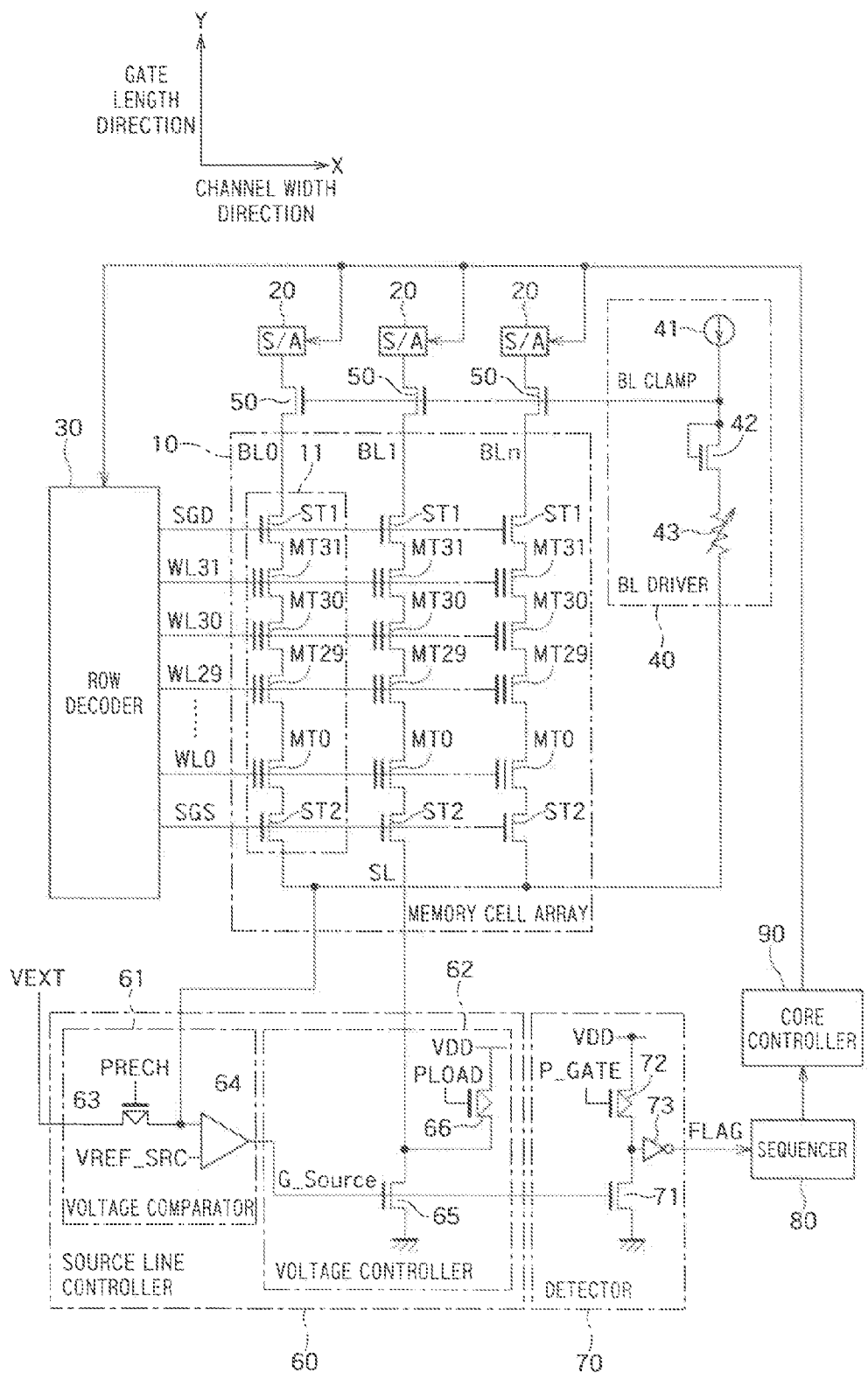
FIG. 1 is a circuit diagram showing a configuration of a nonvolatile semiconductor memory device of an embodiment of the disclosure.

FIG. 1 is a circuit diagram showing a configuration of a nonvolatile semiconductor memory device of an embodiment of the disclosure. The semiconductor memory device of FIG. 1 is a NAND flash memory.

FIG. 1 shows a memory cell array 10 formed on a substrate of the semiconductor memory device. FIG. 1 further shows sense amplifiers (S/A) 20, a row decoder 30, a bit line driver 40, MOS transistors 50, a source line controller 60, a detector 70, a sequencer 80, and a core controller 90, as components of peripheral circuit parts. The memory cell array 10 is an example of the memory cell part of the disclosure.

The memory cell array 10 includes memory cell units 11. Each of the memory cell units 11 includes thirty-two memory cell transistors MT0 to MT31, and two select transistors ST1 and ST2. The memory cell transistors MT0 to MT31 are arranged in line, and are connected in series. The select transistors ST1 and ST2 are arranged to sandwich the memory cell transistors MT0 to MT31, and are connected in series with the memory cell transistors MT0 to MT31. In the following, the respective memory cell transistors MT0 to MT31 will also be referred to as the memory cell transistors MT, and the respective select transistors ST1 and ST2 will also be referred to as the select transistors ST.

In FIG. 1, the row direction and the column direction of the memory cell array 10 are indicated by arrows X and Y, respectively. The X-direction and the Y-direction are equivalent to the channel width direction and the gate width direction of the memory cell transistors MT and the select transistors ST, respectively.

The memory cell transistors MT arranged in the same row are connected to the same one of word lines WL0 to WL31 extending in the X-direction, and the select transistors ST arranged in the same row are connected to the same one of select gate lines SGS and SGD extending in the X-direction. The memory cell transistors MT and the select transistors ST arranged in the same column are connected to the same one of bit lines BL0 to BLn extending in the Y-direction where n is a positive integer, and the select transistors ST2 of the respective columns are connected to a source line SL. The bit lines BL0 to BLn extend in the Y-direction, and are adjacent to one another in the X-direction. In the following, the respective word lines WL0 to WL31 will also be referred to as the word lines WL, the respective select gate lines SGS and SGD will also be referred to as the select gate lines SG, and the respective bit lines BL0 to BLn will also be referred to as the bit lines BL.

Although FIG. 1 shows the memory cell units 11 of n columns and one row, the memory cell array 10 may include memory cell units 11 of n columns and plural rows.

Figure 2:
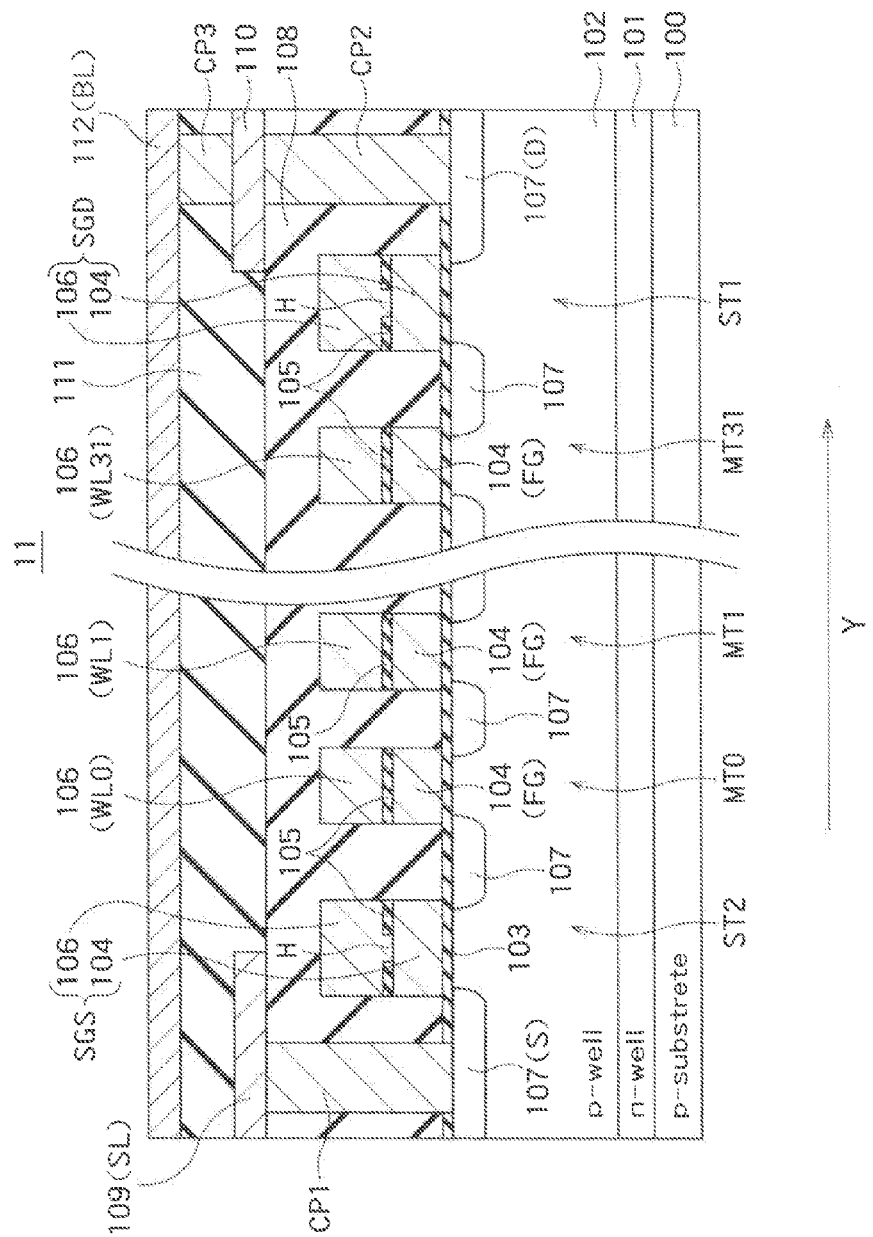
FIG. 2 is a sectional side view showing a structure of a memory cell unit shown in FIG. 1.

FIG. 2 is a sectional side view showing a structure of a memory cell unit 11 shown in FIG. 1. FIG. 2 is a sectional side view of the memory cell unit 11 taken along the Y-direction.

FIG. 2 shows a p-type semiconductor substrate 100 that is an example of the substrate of the disclosure, and an n-type well region 101 and a p-type well region 102 that are formed in the p-type semiconductor substrate 100 in this order. FIG. 2 further shows the memory cell transistors MT0 to MT31 and the select transistors ST1 and ST2 formed in a column on the p-type well region 102.

As shown in FIG. 2, each of the memory cell transistors MT0 to MT31 and the select transistors ST1 and ST2 includes a first insulating layer 103, a first electrode layer 104, a second insulating layer 105, and a second electrode layer 106 that are formed in this order on the p-type well region 102. The first insulating layer 103, the first electrode layer 104, the second insulating layer 105, and the second electrode layer 106 forming each memory cell transistor are called a gate insulator, a floating gate, an intergate insulator, and a control gate, respectively. The gate insulator and the floating gate of each memory cell transistor are examples of the tunnel insulator and the charge storage layer of the disclosure. In each select transistor, on the other hand, the first electrode layer 104 and the second electrode layer 106 are electrically connected to each other through a hole H formed in the second insulating layer 105. The first insulating layer 103 of each select transistor is called a gate insulator, and the first and second electrode layers 104 and 106 of each select transistor are called a gate electrode.

The second electrode layers 106 of the memory cell transistors MT0 to MT31 function as the word lines WL0 to WL31, respectively. Also, the first and second electrode layers 104 and 106 of the select transistors ST1 and ST2 function as the select gate lines SGD and SGS, respectively.

FIG. 2 further shows $n^+$-type impurity diffusion layers 107 formed in the substrate 100 to sandwich the memory cell transistors MT and the select transistors ST, and an inter layer dielectric 108 formed on the substrate 100, so as to cover the memory cell transistors MT and the select transistors ST. The $n^+$-type impurity diffusion layers 107 are shared between adjacent transistors, and function as the source diffusion layers or drain diffusion layers of those transistors. FIG. 2 further shows contact plugs CP1 and CP2 formed on the $n^+$-type impurity diffusion layers 107 adjacent to the select transistors ST2 and ST1.

FIG. 2 further shows interconnect patterns 109 and 110, an inter layer dielectric 111, and a contact plug CP3. The interconnect pattern 109 is formed on the contact plug CP1, and functions as part of the source line SL. The interconnect pattern 110 is formed on the contact plug CP2. The inter layer dielectric 111 is formed on the inter layer dielectric 108, so as to cover the interconnect patterns 109 and 110. The contact plug CP3 is formed on the interconnect pattern 110.

FIG. 2 further shows an interconnect pattern 112. The interconnect pattern 112 is formed on the contact plug CP3, and functions as the bit line BL.

Figure 3:
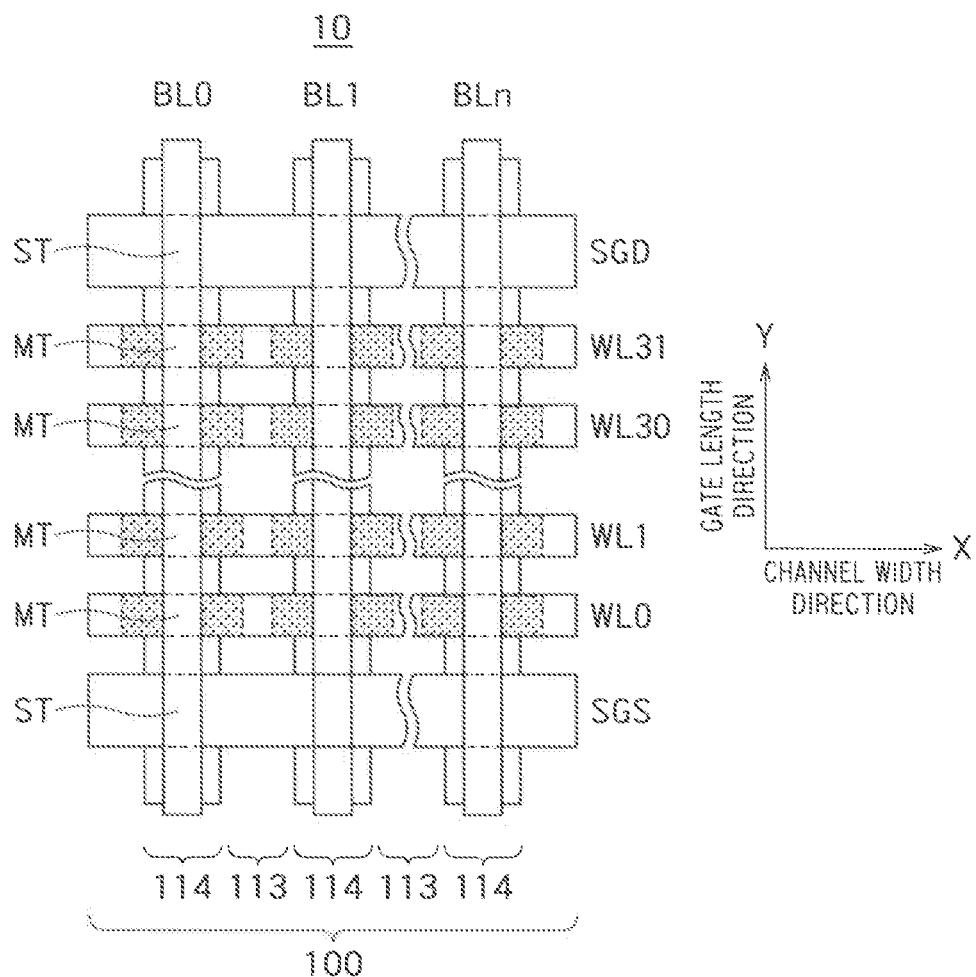
FIG. 3 is a plan view showing a structure of a memory cell array shown in FIG. 1.

The planar structure of the memory cell array 10 is shown in FIG. 3. FIG. 3 is a plan view showing a structure of the memory cell array 10. FIG. 3 shows isolation regions 113 and device regions 114 formed in the substrate 100 under the memory cell array 10. The isolation regions 113 are STI (Shallow Trench Isolation) regions, and are realized by isolation insulators buried in isolation trenches formed on the substrate 100. The device regions 114 are AA (Active Area) regions, and are portions of the substrate 100 sandwiched between the isolation insulators. The isolation regions 113 and the device regions 114 are examples of the first isolation regions and the first device regions of the disclosure. The isolation regions 113 and the device regions 114 extend in the Y-direction, and are alternately arranged along the X-direction, as shown in FIG. 3. The memory cell transistors MT and the select transistors ST are arranged on the device regions 114. FIG. 3 further shows the word lines WL0 to WL31, the select gate lines SGS and SGD, and the bit lines BL0 to BLn, which are arranged on the substrate 100 in the memory cell array 10.

Referring back to FIG. 1, the structure of the semiconductor memory device is described.

The row decoder 30 is configured to apply voltages to the select gate lines SG and the word lines WL when data is written, read, and erased. When data is written, the row decoder 30 applies a program voltage VPGM to a selected word line, and applies a voltage VPASS to unselected word lines. The program voltage VPGM is a high voltage for injecting charges into the charge storage layer, and the voltage VPASS is a voltage for putting the memory cell transistors MT in an ON state.

The MOS transistors 50 are switches connecting the bit lines BL and the sense amplifiers 20. One of the main terminals of each MOS transistor 50 is connected to the corresponding bit line BL, and the other main terminal of each MOS transistor 50 is connected to the corresponding sense amplifier 20. When the MOS transistors 50 are turned on, the memory cell array 10 and the sense amplifiers 20 are electrically connected via the bit lines BL.

The bit line driver 40 is configured to apply a voltage BLCLAMP to the control terminals (gate electrodes) of the MOS transistors 50, to turn on the MOS transistors 50. The bit line driver 40 includes a current supply circuit 41, an n-channel MOS transistor 42, and a variable resistor 43. The current supply circuit 41 is connected to the control terminals of the MOS transistors 50. The n-channel MOS transistor 42 includes a control terminal and a main terminal connected to the current supply circuit 41, and the other main terminal connected to the source line SL via the variable resistor 43.

The sense amplifiers 20 are configured to detect and amplify data that is read from the memory cell transistors MT onto the bit lines BL in data reading operations. In data writing operations, on the other hand, the sense amplifiers 20 transfer write data to the bit lines BL.

Figure 4:
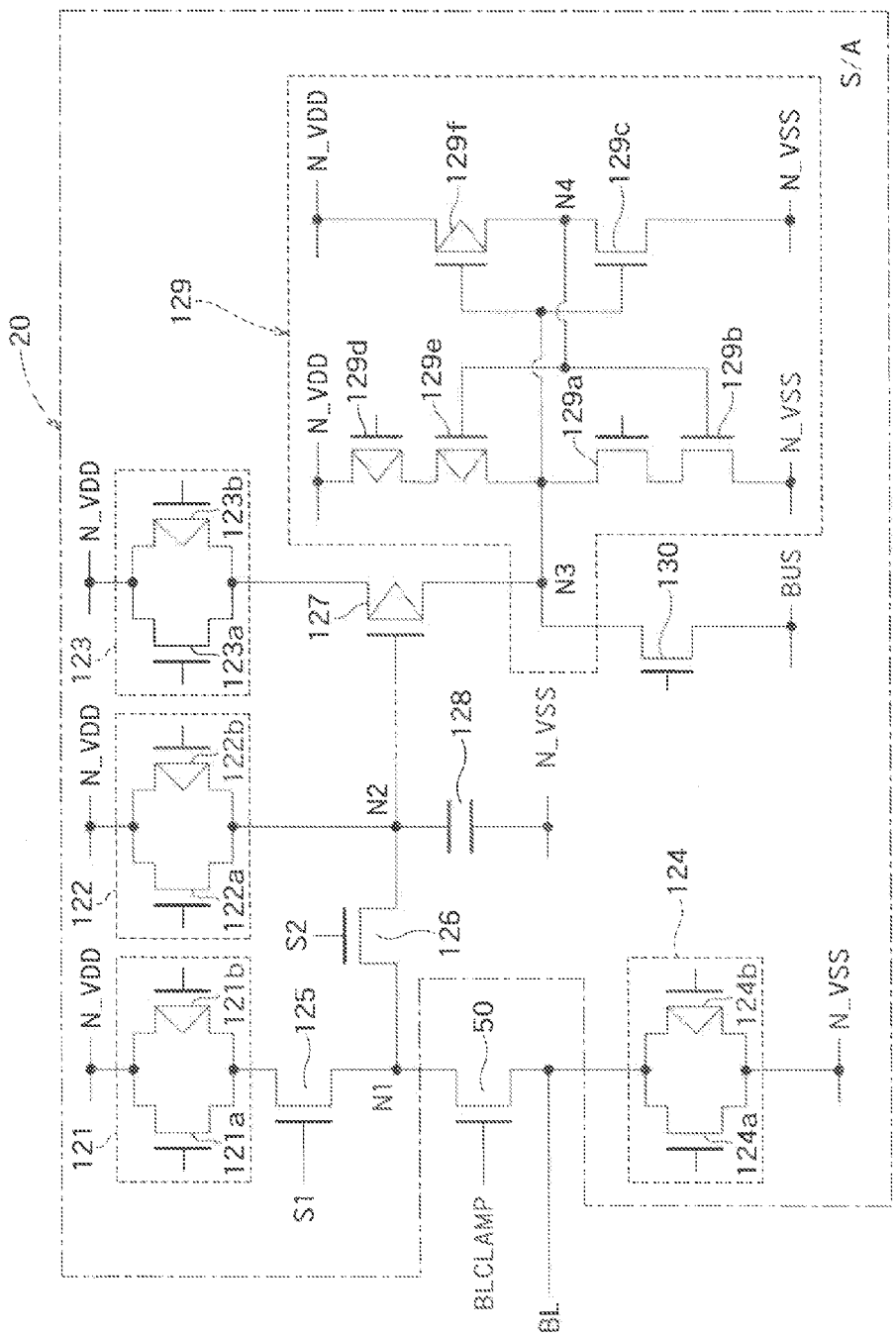
FIG. 4 is a circuit diagram showing a configuration of a sense amplifier shown in FIG. 1.

FIG. 4 is a circuit diagram showing a structure of a sense amplifier 20 shown in FIG. 1.

As shown in FIG. 4, each sense amplifier 20 includes switching devices 121 to 124, n-channel MOS transistors 125 and 126, a p-channel MOS transistor 127, a capacitor 128, a latch circuit 129, and an n-channel MOS transistor 130.

The switching device 121 is placed between a node N1 and a node N_VDD, and the switching device 122 is placed between a node N2 and the node N_VDD. Both of the main terminals of the n-channel MOS transistors 125 are placed between the node N1 and the switching device 121, and both of the main terminals of the n-channel MOS transistor 126 are placed between the node N1 and the node N2. A gate signal S1 is inputted to the control terminal of the n-channel MOS transistor 125, and a gate signal S2 is inputted to the control terminal of the n-channel MOS transistor 126.

Here, each of the switching devices 121 to 124 is formed by connecting one of n-channel MOS transistors 121a to 124a and one of p-channel MOS transistors 121b to 124b in parallel.

Also, the control terminal of the p-channel MOS transistor 127 is connected to the node N2. One of the main terminals of the p-channel MOS transistor 127 is connected to the node N_VDD via the switching device 123, and the other main terminal of the p-channel MOS transistor 127 is connected to the latch circuit 129. Here, the connecting portion between the other main terminal of the p-channel MOS transistor 127 and the latch circuit 129 functions as a node N3. The capacitor 128 is placed between the node N2 and a node N_VSS.

The switching device 124 is placed between the node N1 and the node N_VSS. Both of the main terminals of the corresponding MOS transistor 50 are positioned between node N1 and the switching device 124. The corresponding bit line BL is connected to the node between the switching device 124 and the MOS transistor 50. The switching device 124 connects the bit line BL to the node N_VSS, depending on the data held by the latch circuit 129.

The node N_VDD is the source voltage node of the sense amplifier 20, and the node N_VSS is the ground voltage node of the sense amplifier 20.

The latch circuit 129 includes three n-channel MOS transistors 129a to 129c, and three p-channel MOS transistors 129d to 129f. One of the main terminals of the n-channel MOS transistor 129a is connected to the node N3, and the other main terminal of the n-channel MOS transistor 129a is connected to one of the main terminals of the n-channel MOS transistor 129b. The other main terminal of the n-channel MOS transistor 129b is connected to the node N_VSS. One of the main terminals of the p-channel MOS transistor 129e is connected to the node N3, and the other main terminal of the p-channel MOS transistor 129e is connected to one of the main terminals of the p-channel MOS transistor 129d. The other main terminal of the p-channel MOS transistor 129d is connected to the node N_VDD. The control terminals of the p-channel MOS transistor 129e and the n-channel MOS transistor 129b are connected to a node N4.

One of the main terminals of the p-channel MOS transistor 129f is connected to the node N_VDD, and the other main terminal of the p-channel MOS transistor 129f is connected to the node N4 and one of the main terminals of the n-channel MOS transistor 129c. The other main terminal of the n-channel MOS transistor 129c is connected to the node N_VSS.

The control terminals of the n-channel MOS transistor 129c and the p-channel MOS transistor 129f are connected to the node N3.

Referring back to FIG. 1, the structure of the semiconductor memory device is described.

The source line controller 60 is configured to control the potential of the source line SL. The source line controller 60 includes a voltage comparator 61 and a voltage controller 62.

The voltage comparator 61 is configured to compare the potential of the source line SL with a reference potential VREF_SRC, and output the result of the comparison. The voltage comparator 61 includes a p-channel MOS transistor 63 and a comparator 64. The p-channel MOS transistor 63 includes a control terminal to which a precharge signal PRECH is inputted, a main terminal to which a fixed external voltage VEXT is inputted, and the other main terminal connected to the source line SL. The comparator 64 includes a normal input terminal connected to the source line SL and the p-channel MOS transistor 63, an inverting input terminal to which the reference potential VREF_SRC is inputted, and an output terminal that outputs the result of the comparison between the potential of the source line SL and the reference potential VREF_SRC.

The voltage controller 62 is configured to control the potential of the source line SL, based on the result of the comparison between the potential of the source line SL and the reference potential VREF_SRC. The voltage controller 62 includes an n-channel MOS transistor 65 and a p-channel MOS transistor 66. The n-channel MOS transistor 65 includes a gate terminal connected to the output node G_Source of the comparator 64, a drain terminal connected to the ground voltage, and a source terminal connected to the source line SL. The p-channel MOS transistor 66 includes a gate terminal to which a signal PLOAD is inputted, a drain terminal connected to the source voltage, and a source terminal connected to the source line SL and the source terminal of the n-channel MOS transistor 65.

The detector 70 is configured to detect the total amount of cell current flowing in the source line SL, based on the potential of the node G_Source. The detector 70 determines whether the total amount is larger than a reference current, and outputs the determination result in the form of a flag FLAG. The detector 70 includes an n-channel MOS transistor 71, a p-channel MOS transistor 72, and an inverter 73.

The n-channel MOS transistor 71 includes a gate terminal connected to the node G_Source, and a source terminal connected to the ground voltage. The p-channel MOS transistor 72 includes a gate terminal to which a signal P_GATE is inputted, and a source terminal connected to the source voltage. The inverter 73 includes an input terminal connected to the drain terminals of the n-channel MOS transistor 71 and the p-channel MOS transistor 72, and an output terminal that inverts the voltage level of the input terminal and outputs the inversion result in the form of the flag FLAG. The flag FLAG is output to the sequencer 80.

The sequencer 80 is configured to control data writing operations, data reading operations, and data erasing operations of the semiconductor memory device. The sequencer 80 instructs the core controller 90 to execute a write sequence, a read sequence, or an erase sequence.

The core controller 90 is configured to control the sense amplifiers 20 and the row decoder 30 according to instructions from the sequencer 80. Under the control of the core controller 90, required sequences are executed.

In the following, structures of the sense amplifiers 20 are described in greater detail.

Figure 5:
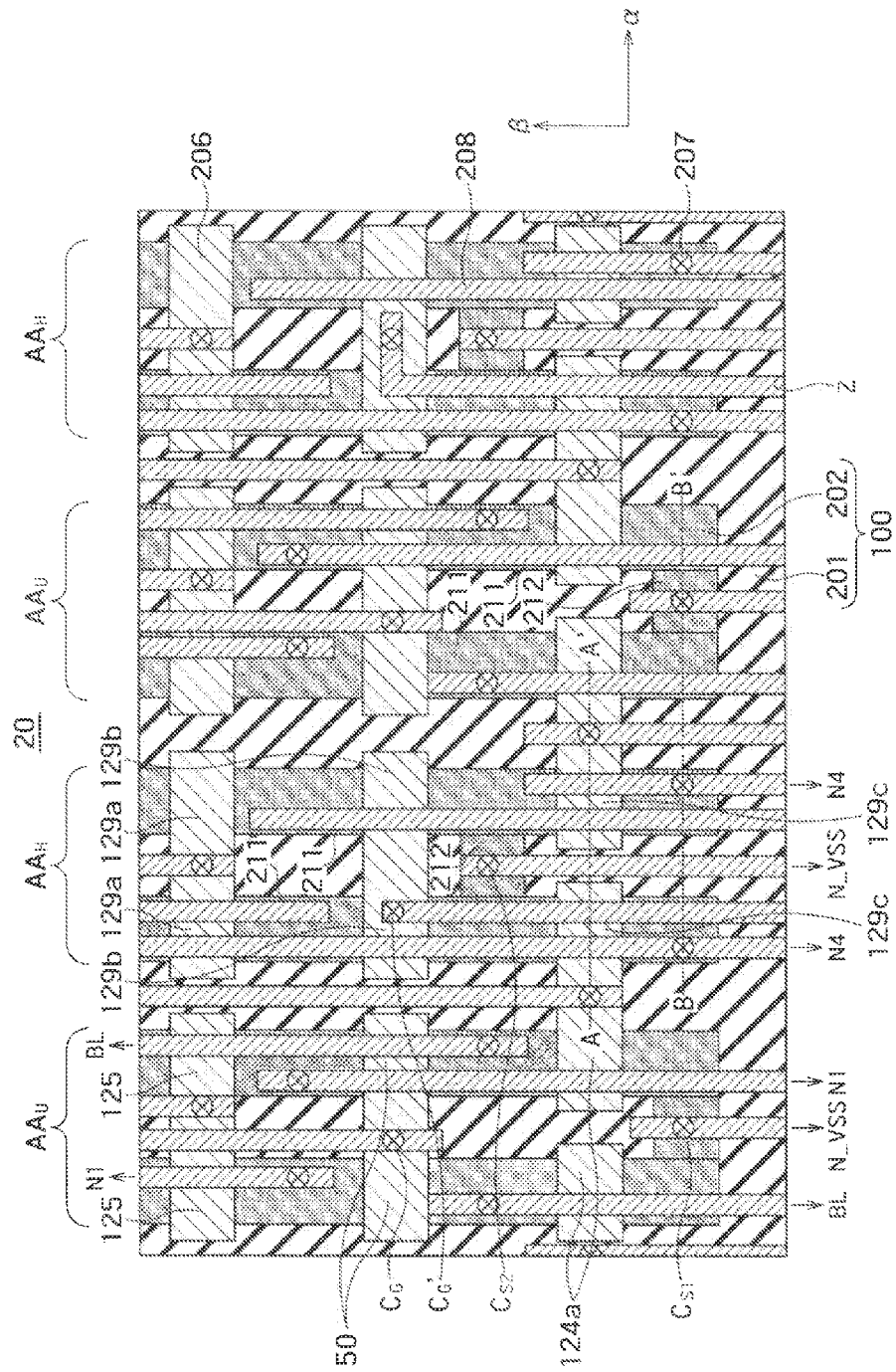
FIG. 5 is a plan view showing structures of sense amplifiers shown in FIG. 1.

FIG. 5 is a plan view showing structures of the n-channel MOS transistors in the sense amplifiers 20 of FIG. 1. As described above, the sense amplifiers 20 are provided in the peripheral circuit parts on the substrate 100.

FIG. 5 shows isolation regions 201 and device regions 202 formed in the substrate 100 under the sense amplifiers 20. The isolation regions 201 are STI (Shallow Trench Isolation) regions, and are realized by isolation insulators buried in isolation trenches formed on the substrate 100. The device regions 202 are AA (Active Area) regions, and are portions of the substrate 100 sandwiched between the isolation insulators. The device regions 202 are isolated from one another by the isolation regions 201. The isolation regions 201 and the device regions 202 are examples of the second isolation regions and the second device regions of the disclosure.

FIG. 5 shows four device regions 202. Each of the device regions 202 includes two stripe portions 211 extending in a direction parallel to the surface of the substrate 100 and having stripe shapes, and one connecting portion 212 connecting the stripe portions 211 to each other. In each device region 202, the two stripe portions 211 and the one connecting portion 212 are connected to each other. The two stripe portions 211 of each device region 202 are an example of the first and second stripe portions of the disclosure. Also, the one connecting portion 212 of each device region 202 is an example of the connecting portion of the disclosure.

FIG. 5 shows an α-direction and a β-direction that are parallel to the surface of the substrate 100 and are perpendicular to each other. In this embodiment, the stripe portions 211 are arranged parallel to one another, so as to extend in the β direction. The α-directional width of each stripe portion 211 and the α-directional distance between adjacent stripe portions 211 are fixed. In addition, the width of each stripe portion 211 and the distance between adjacent stripe portions 211 are substantially equal to each other in this embodiment. The width of each stripe portion 211 is an example of the first width of the disclosure, and the distance between adjacent stripe portions 211 is an example of the first interval of the disclosure. Also, the α-direction and the β-direction are examples of the second direction and the first direction of the disclosure, respectively.

Among the four device regions 202 shown in FIG. 5, the two device regions 202 denoted by $AA_U$ have U-shapes in a plan view, and the two device regions 202 denoted by $AA_H$ have H-shapes in a plan view. In FIG. 5, the U-shaped device regions 202 and the H-shaped device regions 202 are alternately arranged along the α-direction. In each device region 202, the two stripe portions 211 extend in the β-direction and are adjacent to each other in the α-direction.

In FIG. 5, gate electrodes forming peripheral transistors are denoted by reference numeral 206. The peripheral transistors are formed at the intersection points between the device regions 202 and the gate electrodes 206. Each of the peripheral transistors includes a gate insulator and a gate electrode formed in this order on a device region 202. In this embodiment, each of the gate electrodes 206 includes a first portion formed on a device region 202 and a second portion formed on an isolation region 201, and is continuously formed on two stripe portions 211.

More specifically, the gate electrodes 206 shown in FIG. 5 are the second electrode layers of the first and second electrode layers forming the gate electrodes (described later in detail). The gate electrodes 206 are also called gate conductors (GC).

The semiconductor memory device of this embodiment has interconnect layers formed on the substrate 100. The lowest interconnect layer among the interconnect layers is called an MO interconnect layer. FIG. 5 shows interconnects (interconnect patterns) 208 as the MO interconnect layer. The interconnects 208 are an example of the plurality of interconnects included in the same interconnect layer of the disclosure. In FIG. 5, the interconnects 208 are provided in the sense amplifiers 20.

Each of the interconnects 208 has a stripe shape extending roughly in the β-direction. In FIG. 5, two interconnects 208 are provided on each of the stripe portions 211, and one interconnect 208 is provided on each of the connecting portions 212. Accordingly, five of more interconnects 208 are provided on each of the device regions 202 denoted by $AA_U$ and $AA_H$. On the other hand, one interconnect 208 is provided between adjacent device regions 202 denoted by $AA_U$ and $AA_H$.

In this arrangement, the α-directional width of each stripe portion 211 is greater than the α-directional width of each interconnect 208. The α-directional width of each connecting portion 212 is also greater than the α-directional width of each interconnect 208. The α-directional width of the portion existing between adjacent device regions 202 is also greater than the α-directional width of each interconnect 208. The width of each interconnect 208 is an example of the second width of the disclosure. The interconnects 208 shown in FIG. 5 extend roughly in the β-direction (i.e., have portions extending in the β-direction), and are adjacent to one another in the α-direction. In FIG. 5, the interconnect 208 indicated by Z includes a portion extending in the β-direction, and a portion extending in a direction other than the β-direction.

In FIG. 5, two or more interconnects 208 may be placed on each stripe portion 211, and one or more interconnects 208 may be placed on each connecting portion 212. Also, one or more interconnects 208 may be placed in the portion existing between adjacent device regions 202 denoted by $AA_U$ and $AA_H$.

FIG. 5 further shows contact plugs 207 formed on the stripe portions 211, on the connecting portions 212, and on the gate electrodes 206. Each of the contact plugs 207 is placed under an interconnect 208, and is electrically connected to the interconnect 208.

In FIG. 5, the contact plugs 207 corresponding to source contacts are denoted by $C_{S1}$ and $C_{S2}$. Each of the source contacts $C_{S1}$ and $C_{S2}$ is formed on a connecting portion 212, and is electrically connected to an interconnect 208. The source diffusion layers of the peripheral transistors and the source lines are electrically connected by the source contacts $C_{S1}$ and $C_{S2}$. In this embodiment, only one source contact is formed on each device region 202, and the source contact is placed on a connecting portion 212. The ground potential VSS is supplied to the source contacts $C_{S1}$ and $C_{S2}$.

Here, first main terminals of the two n-channel MOS transistors 124a are connected to the source contact $C_{S1}$ so that the source contact $C_{S1}$ is shared. Second main terminals of the n-channel MOS transistors 124a are connected to the bit lines BL and first main terminals of the n-channel MOS transistors 50, respectively. Second main terminals of the n-channel MOS transistors 50 are connected to first main terminals of the n-channel MOS transistors 125, respectively. In this manner, in each device region 202 denoted by $AA_U$, the n-channel MOS transistors of two sense amplifiers 20 are connected by the connecting portion 212, and share the ground potential VSS through the connecting portion 212.

Also, first main terminals of the two n-channel MOS transistors 129c and first main terminals of the two n-channel MOS transistors 129b are connected to the source contact $C_{S2}$ so that the source contact $C_{S2}$ is shared. Second main terminals of the n-channel MOS transistors 129b are connected to first main terminals of the n-channel MOS transistors 129a, respectively. Second main terminals of the n-channel MOS transistors 129a are connected to the node N4.

In FIG. 5, the contact plug 207 corresponding to a gate contact is further shown and denoted by $C_G$. The gate contact $C_G$ is formed on a second portion of a gate electrode 206 located on an isolation region 201, and is electrically connected to an interconnect 208. The gate electrode 206 and a signal line designed for the gate electrode 206 are electrically connected by the gate contact $C_G$. In this embodiment, each gate electrode 206 is shared between two peripheral transistors. Further, only one gate contact $C_G$ is formed on each gate electrode 206, and the gate contact $C_G$ is placed on the second portion of the gate electrode 206 located on the isolation region 201.

In this embodiment, a gate contact may be formed on a first portion of a gate electrode 206 located on a device region 202, and may be electrically connected to an interconnect 208. In FIG. 5, an example of such a gate contact is shown and denoted by $C_G'$. By placing the gate contact $C_G'$ on the first portion of the gate electrode 206 located on the device region 202, the distance between the gate contact $C_G'$ and the peripheral transistor PT located below the gate electrode 206 can be advantageously made shorter.

The semiconductor memory device of this embodiment includes both the gate contact $C_G$ formed on a gate electrode 206 on an isolation region 201, and the gate contact $C_G'$ formed on a gate electrode 206 on a device region 202. With those gate contacts coexisting, routing of the interconnects 208 can be advantageously made easier. The gate contacts $C_G$ and $C_G'$ are examples of the first and second gate contacts of the disclosure.

Figure 6:
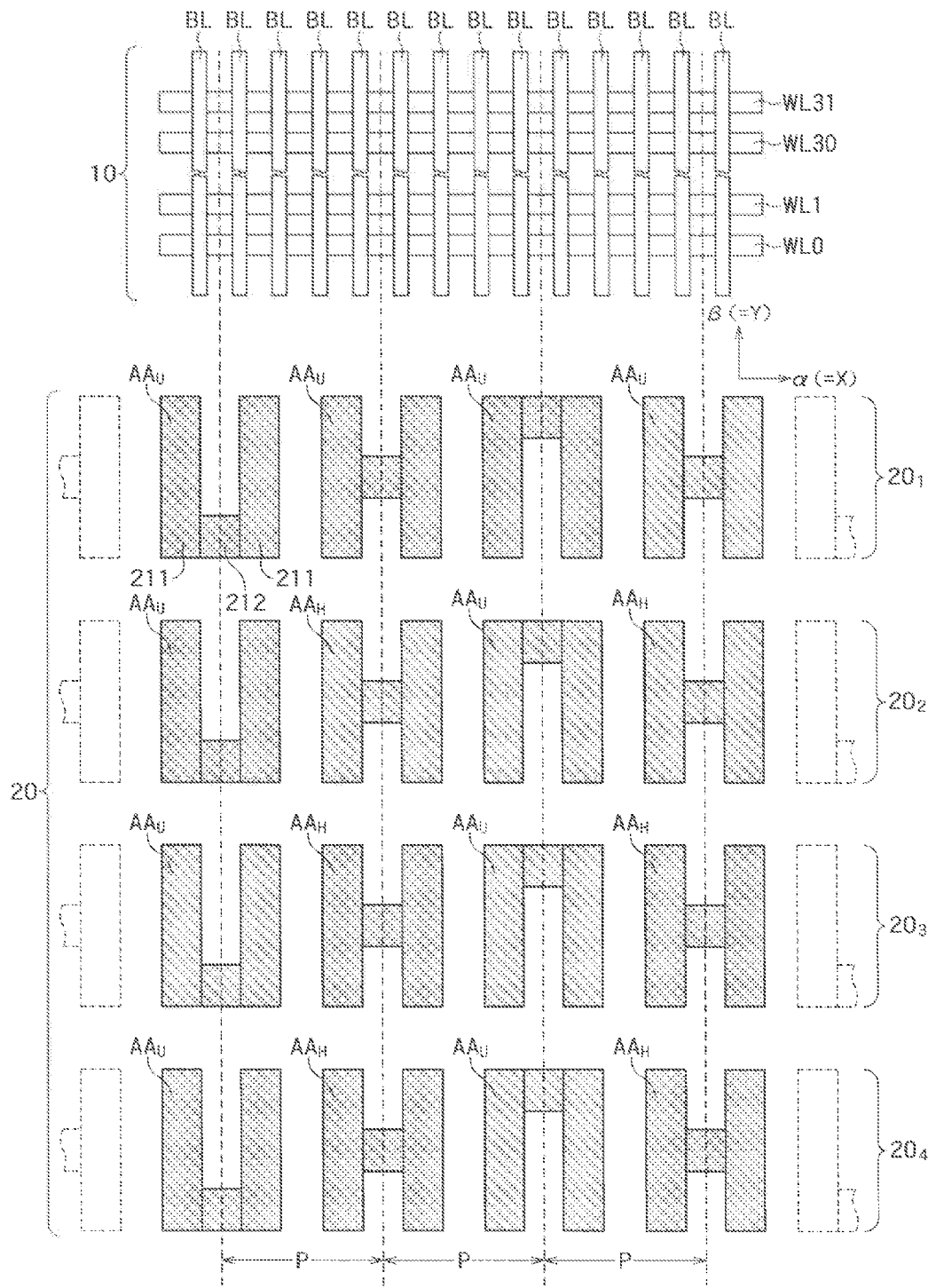
FIG. 6 is a plan view schematically showing structures of the memory cell array and the sense amplifiers shown in FIG. 1.

FIG. 6 is a plan view schematically showing structures of the memory cell array 10 and the sense amplifiers 20 of FIG. 1.

As shown in FIG. 6, the α-direction and β-direction are equal to the X-direction and the Y-direction, respectively. Accordingly, as shown in FIG. 6, the direction in which the stripe portions 211 extend is equal to the direction in which the bit lines BL extend, and the direction in which the stripe portions 211 are adjacent to one another is equal to the direction in which the bit lines BL are adjacent to one another.

In the substrate 100 under the sense amplifiers 20, the U-shaped and H-shaped device regions 202 are arranged, for example, along the α-direction and β-direction, as shown in FIG. 6. FIG. 6 shows a situation where four device regions 202 are arranged in the α-direction, and four device regions 202 are arranged in the β-direction. It is noted that FIG. 5 shows one column of device regions 202 arranged in the α-direction among those device regions 202.

As shown in FIG. 6, in each row in the α-direction, a U-shaped device region 202, an H-shaped device region 202, an upside-down U-shaped device region 202 (hereinafter referred to as an "inverted U-shaped device region 202"), and another H-shaped device region 202 are arranged in this order. In each row in the α-direction in this embodiment, this sequence of device regions 202 repeatedly appear. In other words, four device regions 202 form one cycle in the α-direction. One of the U-shaped and inverted U-shaped device regions 202 is an example of the second device region having a U-planar-shape when seen from the positive direction of the first direction (right U-shaped second device region), and the other one of the U-shaped and inverted U-shaped device regions 202 is an example of the second device region having a U-planar-shape when seen from the negative direction of the first direction (inverted U-shaped second device region). The four device regions 202 forming one cycle are an example of N device regions 202 forming one cycle, where N is an integer equal to or greater than two. The value of N may be an integer other than four.

On the other hand, in each column in the β-direction, device regions 202 having the same shape are arranged. For example, in the leftmost column, U-shaped device regions 202 are arranged. In the rightmost column, H-shaped device regions 202 are arranged. In the second leftmost column, H-shaped device regions 202 are arranged. In the second rightmost column, inverted U-shaped device regions 202 are arranged. As a result, in each row in the α-direction, four device regions 202 form one cycle. In each column in the β-direction in FIG. 6, the device regions 202 in first, second, third, and fourth rows form first, second, third, and fourth sense amplifiers $20_1$, $20_2$, $20_3$, and $20_4$, respectively.

In this embodiment, however, device regions 202 arranged in each column in the β-direction may not have the same shape, as long as each four device regions 202 in each row in the α-direction form one cycle. For example, in FIG. 6, the second and fourth rows among the four rows in the α-direction may have an inverted U-shaped device region 202, an H-shaped device region 202, a U-shaped device region 202, and another H-shaped device region 202 in this order. In this case, in the leftmost column among the four columns in the β-direction, U-shaped device regions 202 and inverted U-shaped device regions 202 are alternately arranged.

In FIG. 6, the repetition pitch of the device regions 202 in the α-direction is denoted by P. In this embodiment, the pitch P is set at a constant value. The pitch P is substantially equal to the total width of two stripe portions 211, one connecting portion 212, and one isolation region 201 between adjacent two stripe portions 211.

In this embodiment, the bit lines BL are arranged so that 4×K bit lines BL are included in each one pitch P, where K is an integer equal to or greater than one. With this arrangement, 16×K bit lines BL are arranged in each one cycle of the device regions 202 in the α-direction (i.e., in each four pitches P) in this embodiment. In FIG. 6, four bit lines BL are arranged in each one pitch P.

Generally, 16×K bit lines BL are regarded as one unit in a nonvolatile semiconductor memory device. For example, a circuit layout in which 16×K bit lines BL and two dummy bit lines arranged to sandwich the 16×K bit lines BL are regarded as one cycle may be employed.

With the readiness of the layout designing of the interconnects for connecting the memory cell array 10 to the sense amplifiers 20 being taken into consideration, one cycle of the device regions 202 in the α-direction is preferably set at such a length as to accommodate 16×K bit lines BL. Therefore, one pitch P of the device regions 202 in the α-direction is set at such a length as to accommodate 4×K bit lines BL, and 4×K bit lines BL are arranged in each one pitch P in this embodiment. With this arrangement, the layout designing of the interconnects for connecting the memory cell array 10 to the sense amplifiers 20 can be made easier in this embodiment.

The bit lines BL are electrically connected to the device regions 202 via the MOS transistors 50, the interconnects 208, and the contact plugs 207 shown in FIG. 5. Each of the bit lines BL is electrically connected to one of the U-shaped or H-shaped device regions 202 shown in FIG. 6. The repetition pitch of the stripe portions 211 in FIG. 5 (defined identically with the pitch P in FIG. 6) is set at such a length as to accommodate 4×K (K=8) bit lines BL, for example. In FIG. 5, however, it should be noted that not seven bit lines BL but seven interconnects 208 are arranged in each one repetition pitch.

The α-directional width of each interconnect 208 in FIG. 5 is set greater than the α-directional (X-directional) width of each bit line BL. This is because each bit line BL is connected with the corresponding device region 202 adjacent in the β-direction by routing the corresponding interconnect 208. In this embodiment, each device region 202 is connected with two bit lines BL. Therefore, in a case where eight bit lines BL are arranged in each one pitch P, respective two bit lines BL of those eight bit lines BL are connected with one of the first to fourth sense amplifiers $20_1$ to $20_4$.

In this embodiment, each bit line BL is positioned so as to be connected to a device region 202 existing in the same pitch P. Such an interconnect arrangement has the advantage that the bending of the interconnects 208 shown in FIG. 5 is reduced, and the layout designing of the interconnects 208 is made easier. In this manner, the layout designing in this embodiment can be made easier by assigning 4×K bit lines BL to each one pitch P.

Next, the sectional shape of each sense amplifier 20 is described.

Figure 7:
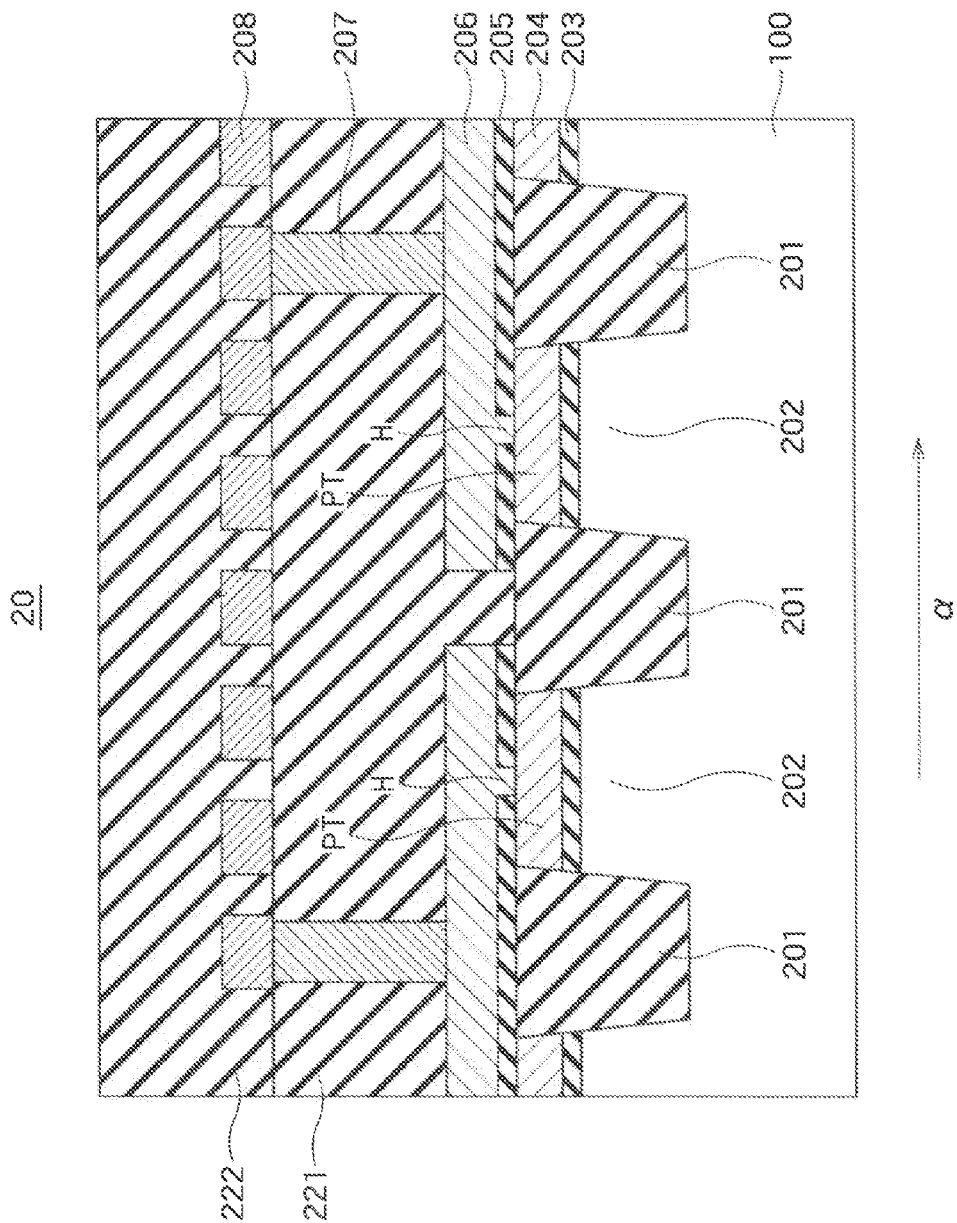
FIG. 7 is a sectional side view taken along a line A-A' shown in FIG. 5.

FIG. 7 is a sectional side view taken along the line A-A' shown in FIG. 5. Further, FIG. 8 is a sectional side view taken along the line B-B' shown in FIG. 5.

FIG. 7 shows peripheral transistors PT formed on the substrate 100. Each peripheral transistor PT includes a first insulating layer 203, a first electrode layer 204, a second insulating layer 205, and a second electrode layer 206, which are formed in this order on the substrate 100. In each peripheral transistor PT, the first electrode 204 and the second electrode layer 206 are electrically connected through a hole H formed in the second insulating layer 205. The first insulating layer 203 of each peripheral transistor PT is called a gate insulator, and the first and second electrode layers 204 and 206 of each peripheral transistor PT are called a gate electrode. In FIG. 5, the planar shape of the second electrode layer 206 is shown.

FIG. 7 further shows first and second inter layer dielectrics 221 and 222 formed in this order on the substrate 100. The first insulating layer 221 is formed on the substrate 100, so as to cover the peripheral transistors PT. The contact plugs 207 are buried in contact holes formed in the first inter layer dielectric 221, and the interconnects 208 are formed on the first inter layer dielectric 221. The second inter layer dielectric 222 is formed on the first inter layer dielectric 221, so as to cover the interconnects 208.

Figure 8:
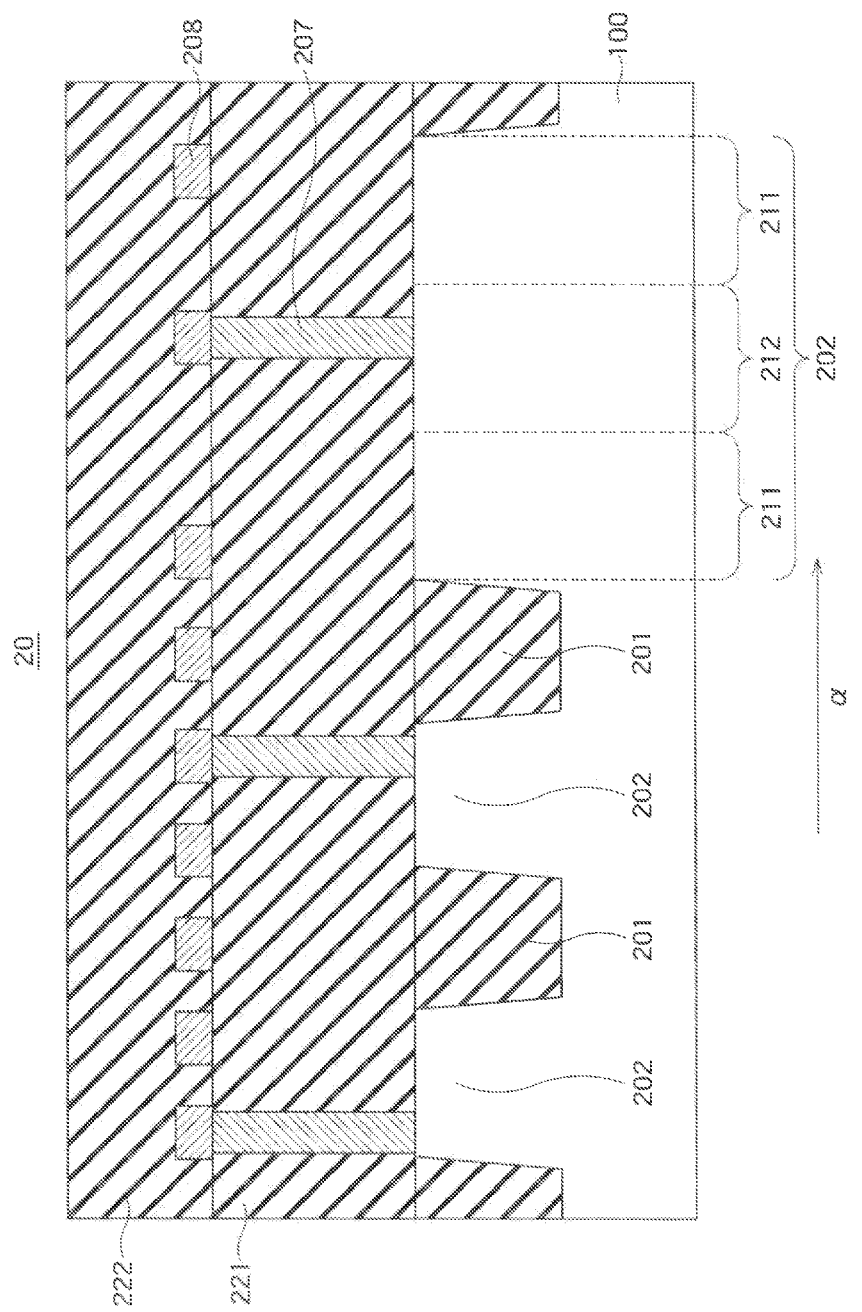
FIG. 8 is a sectional side view taken along a line B-B' shown in FIG. 5.

FIG. 8 shows a cross-section taken along a line laterally transversing stripe portions 211 and a connecting portion 212, where one contact plug 207 is formed on the connecting portion 212. Here, the α-directional width of each device region 202 in the cross-section laterally transversing the stripe portions 211 and the connecting portion 212 is substantially equal to the total width of two stripe portions 211 and one connecting portion 212. As a result, the alignment margin of the contact plugs 207 in the α-direction is improved.

Figure 9:
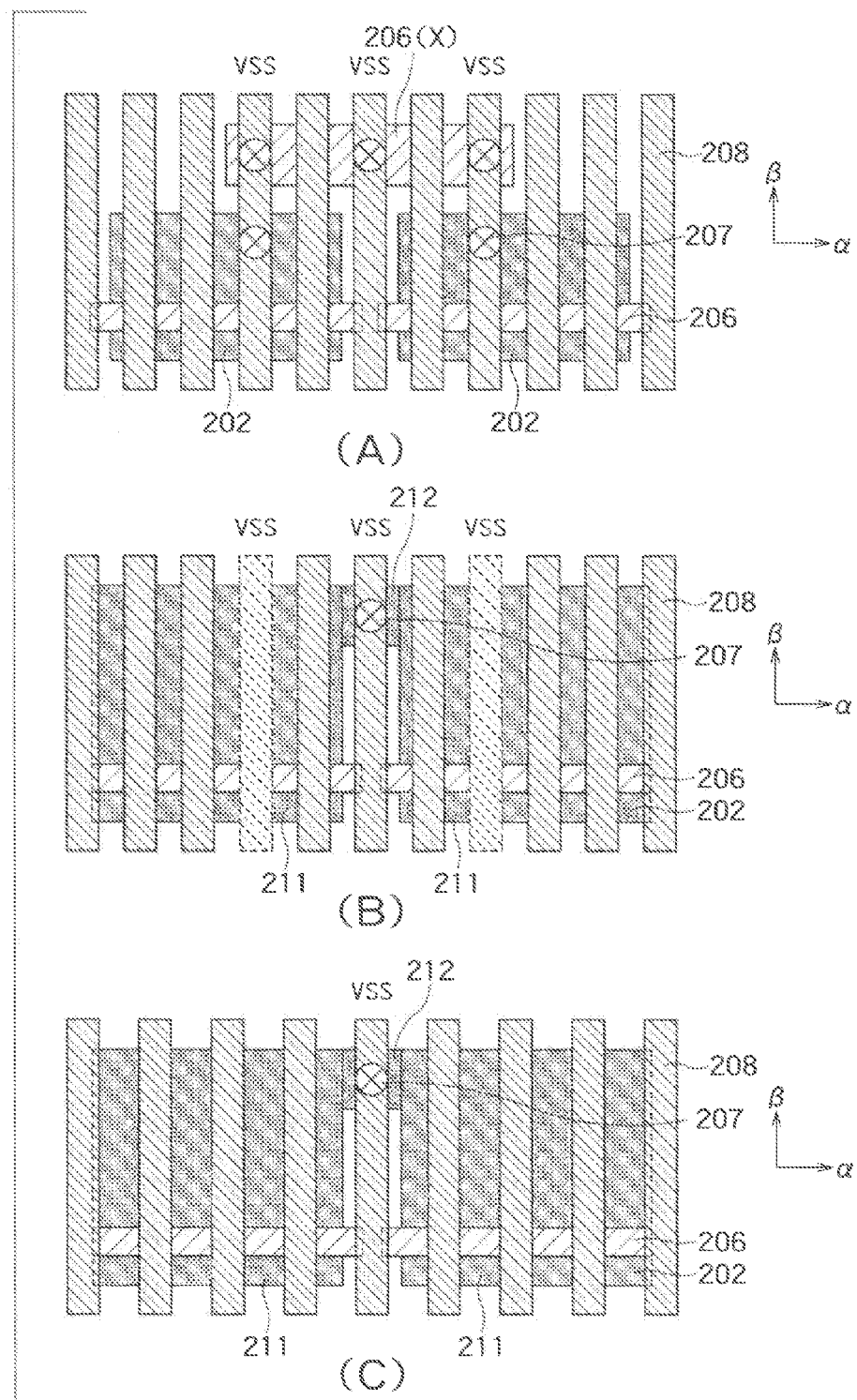
FIGS. 9 and 10 are plan views for explaining advantages of the semiconductor memory device of this embodiment.
Figure 10:
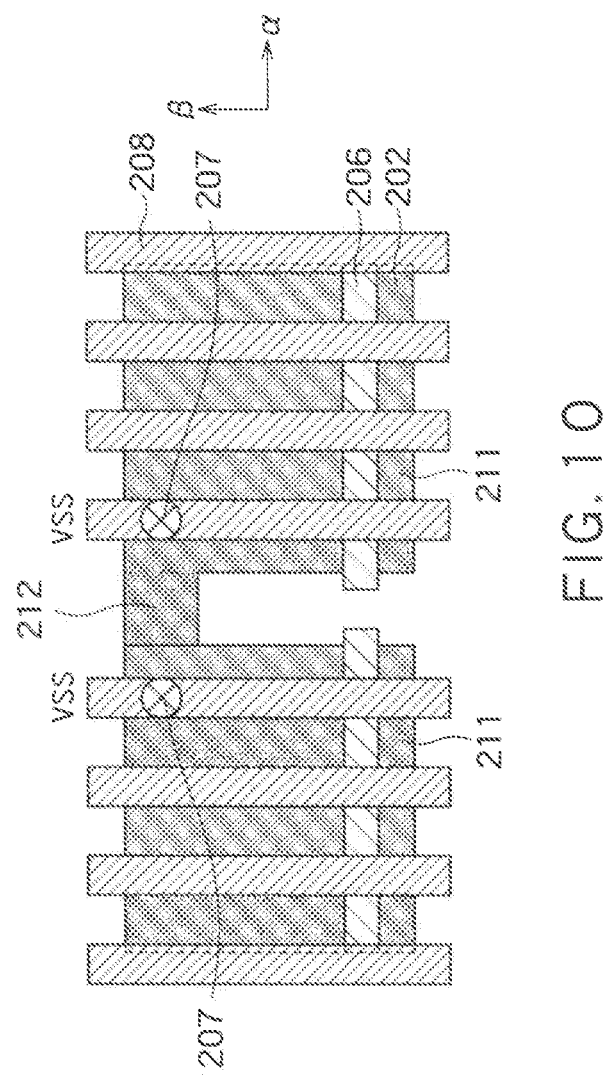

Advantages of the semiconductor memory device of this embodiment are now described. FIGS. 9 and 10 are plan views for explaining the advantages of the semiconductor memory device of this embodiment.

FIG. 9(A) shows planar structures of sense amplifiers 20 of a comparative example, and shows interconnects (MO interconnects) 208 of one pitch. In FIG. 9(A), eleven interconnects 208 are arranged in one pitch.

FIG. 9(A) further shows two device regions 202, three gate electrodes 206, and five contact plugs 207. The five contact plugs 207 are source contacts. Three of the five contact plugs 207 are arranged on a gate electrode 206, and the other two are arranged on the device regions 202. The two device regions 202 are connected to a source line by the three interconnects 208 denoted by VSS, the gate electrode 206 denoted by X, and the above described five contact plugs 207.

In the case illustrated in FIG. 9(A), the interconnects 208 are placed at a higher density when the α-directional width of each device region 202 is smaller. Accordingly, the distance between each two interconnects 208, and the distances between the contact plugs 207 and the interconnects 208 become shorter. Because of this, there is a possibility that short-circuiting might be caused between the interconnects 208 or between the contact plugs 207 and the interconnects 208.

FIG. 9(B) shows planar structures of the sense amplifiers 20 of this embodiment, and shows the interconnects (MO interconnects) 208 of one pitch.

In this embodiment, two stripe portions 211 are connected by one connecting portion 212 to form one device region 202. A contact plug (source contact) 207 is placed on the connecting portion 212, and a VSS interconnect 208 is placed on the contact plug 207. As a result, the device region 202 shown in FIG. 9(B) is connected to a source line by the one VSS interconnect 208 and the one contact plug 207, without the use of a gate electrode 206.

In FIG. 9(B), the one VSS interconnect 208 is indicated with solid lines, and two VSS interconnects 208 are indicated with broken lines. In this embodiment, the two VSS interconnects 208 are unnecessary. Accordingly, by eliminating the unnecessary VSS interconnects 208, the number of interconnects 208 placed in the sense amplifiers 20 can be reduced in this embodiment.

While five source contacts 207 are required in FIG. 9(A), one source contact 207 is enough in FIG. 9(B). Accordingly, in this embodiment, the number of source contacts 207 placed in the sense amplifiers 20 can be reduced.

FIG. 9(C) shows a situation where the two VSS interconnects 208 shown in FIG. 9(B) are removed, and the remaining interconnects 208 are arranged at regular intervals. In this embodiment, by reducing the number of interconnects 208 placed in the sense amplifiers 20, the distance between each two interconnects 208 and the distance between the contact plug 207 and the interconnect 208 can be made longer, as shown in FIG. 9(C). With this arrangement, short-circuiting between each two interconnects 208 and between the contact plug 207 and the interconnect 208 can be reduced.

According to this embodiment, by widening the distance between each two interconnects 208, flexibility of the interconnect layout can be made higher, the breakdown voltage between the interconnects can be made higher, and the signal transmission rate can be made higher through a decrease in the CR time constant caused by a decrease in parasitic capacitance between adjacent interconnects.

The sense amplifiers 20 of the comparative example and this embodiment shown in FIG. 9 were experimentally manufactured. As a result, it became apparent that the number of interconnects 208 in the sense amplifiers 20 of this embodiment can be made about 10% smaller than that in the sense amplifiers 20 of the comparative example.

Referring back to FIG. 5, the advantages of the semiconductor memory device of this embodiment are described.

As described above, stripe portions 211 are connected to each other by a connecting portion 212 to form one device region 202 in the sense amplifiers 20 in this embodiment. With this arrangement, the stripe portions 211 can be connected to the source line, without the use of a gate electrode 206. As a result, the number of interconnects 208 placed in the sense amplifiers 20 can be reduced by reducing the number of interconnects 208 for connecting the stripe portions 211 to the source line.

Although the source contacts $C_S$ are formed on the connecting portions 212, they may be formed on the stripe portions 211 (see FIG. 10). However, the formation of the source contacts $C_S$ formed on the connecting portions 212 has the advantage that the distances between the source contacts $C_S$ and each stripe portion 211 can be made shorter, and the potential of each stripe portion 211 can be stabilized.

Also, by connecting stripe portions 211 to each other by one connecting portion 212, more than one stripe portion 211 can be connected to the source line by one source contact $C_S$ in this embodiment. For this reason, only one source contact $C_S$ is placed on each device region 202 in this embodiment. With this arrangement, the number of source contacts $C_S$ in the sense amplifiers 20 and the number of interconnects 208 for the source contacts $C_S$ are advantageously reduced in this embodiment.

Although the planar shape of each device region 202 is a U-shape or H-shape in this embodiment, each device region 202 may have some other planar shape. In the following, modifications of the shapes of the device regions 202 are described.

(Modifications of Shapes of Device Regions 202)

Figure 11:
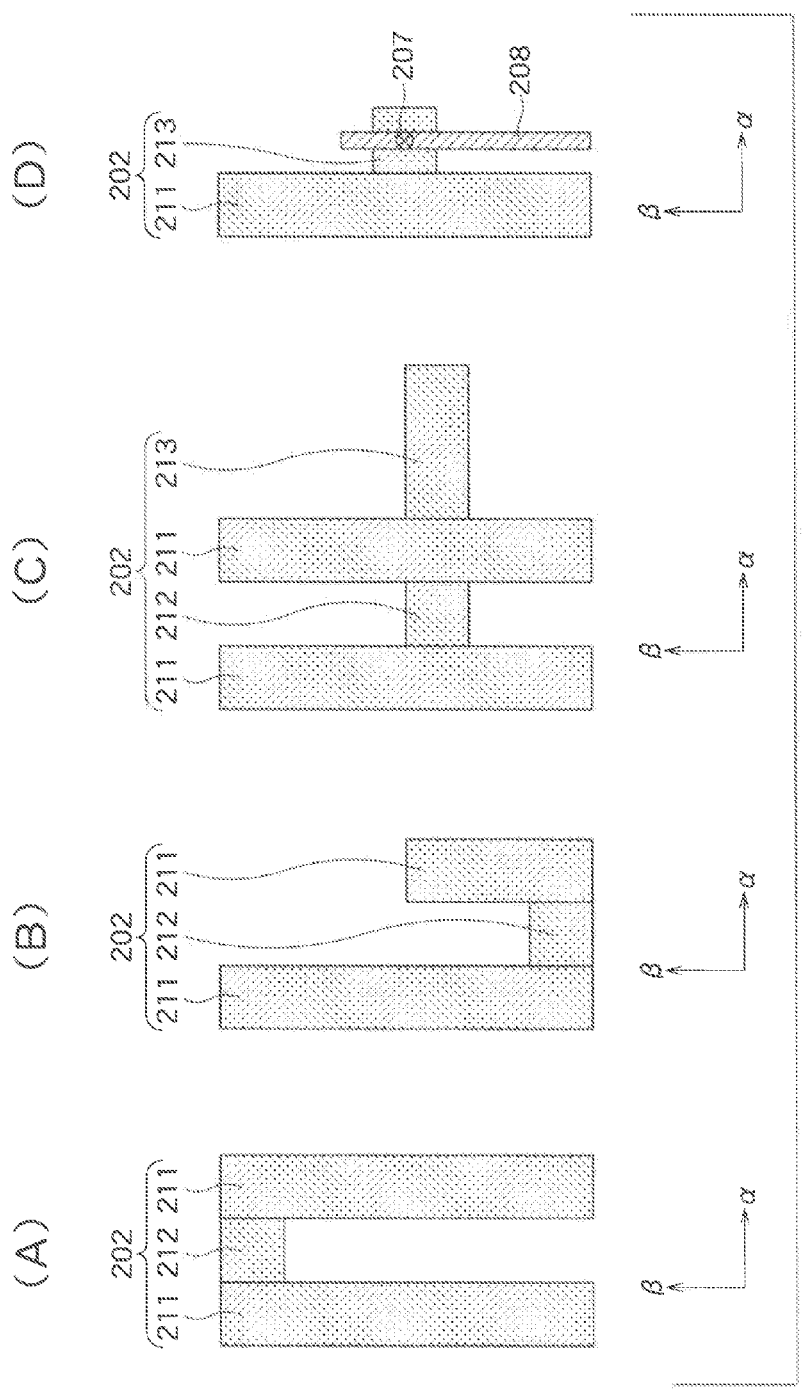
FIG. 11 is a plan view showing modifications of shapes of device regions.

FIG. 11 is a plan view showing modifications of the shapes of the device regions 202.

FIG. 11(A) shows an inverted U-shaped device region 202. As shown in this drawing, the planar shape of a device region 202 may be a U-shape or an inverted U-shape. Further, the planar shape of a device region 202 may be a U-shape or H-shape rotated 90 degrees clockwise or counterclockwise.

FIG. 11(B) shows a U-shaped device region 202 having two stripe portions 211 with different lengths from each other. As shown in this drawing, a device region 202 may include stripe portions 211 having different lengths from one another.

FIG. 11(C) shows a device region 202 that has two stripe portions 211, one connecting portion 212, and a protruding portion 213 protruding from a side face of one of the stripe portions 211. As shown in this drawing, a device region 202 may include a portion in addition to the stripe portions 211 and the connecting portion 212. Also, a device region 202 may include three or more stripe portions 211 and two or more connecting portions 212 (and may further include portions in addition to the stripe portions and the connecting portions).

FIG. 11(D) shows a device region 202 that has one stripe portion 211 and one protruding portion 213. As shown in this drawing, a device region 202 may be formed by one stripe portion 211 and one connecting portion 212, instead of two stripe portions 211 and one connecting portion 212. In this case, a contact plug 207 corresponding to a source contact is preferably placed on the protruding portion 213, as shown in FIG. 11(D). FIG. 11(D) further shows an interconnect 208 placed on the source contact 207.

With those modifications, the same effects as those of the device regions 202 in the shapes shown in FIG. 5 can be achieved.

(Details of Shapes of Device Regions 202)

Figure 12:
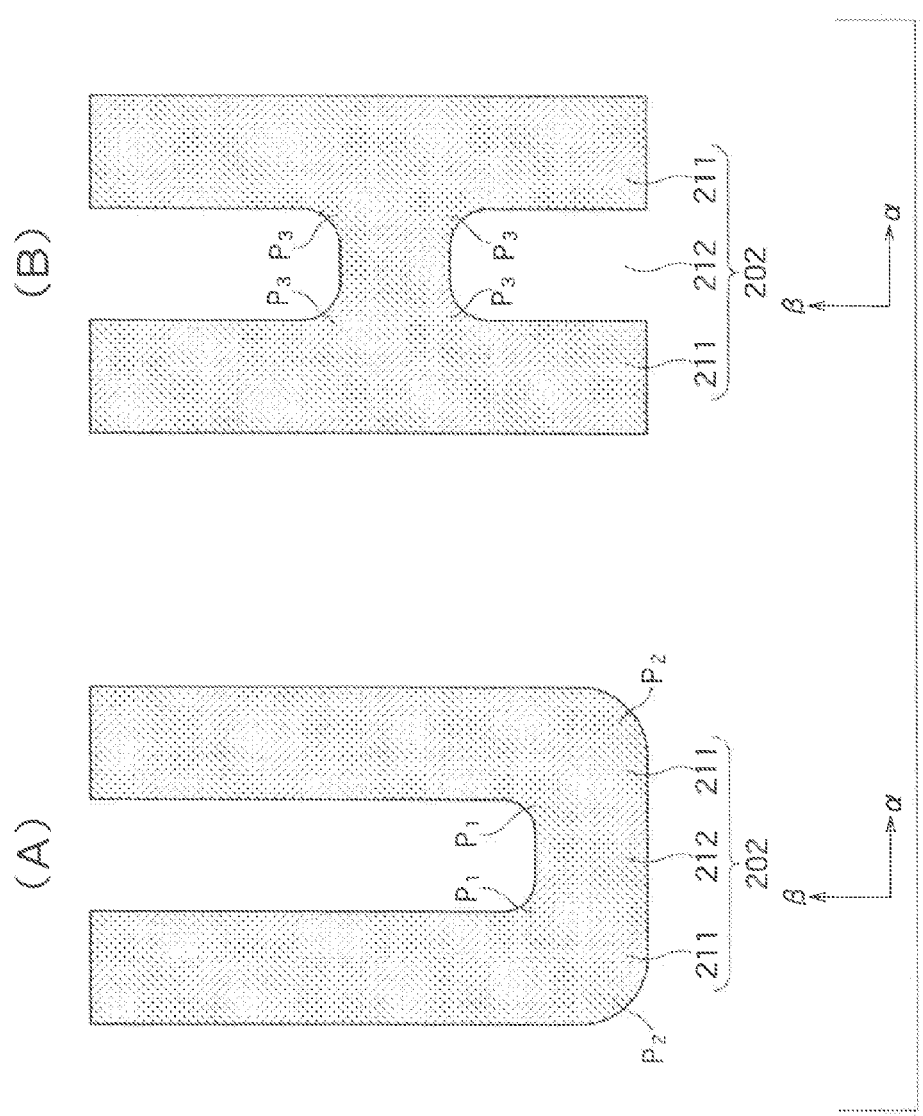
FIG. 12 is a plan view for explaining details of the shapes of the device regions.

FIG. 12 is a plan view for explaining details of the shapes of the device regions 202.

FIG. 12(A) shows the details of the planar shape of a U-shaped device region 202. FIG. 12(B) shows the details of the planar shape of an H-shaped device region 202.

Normally, a device region 202 is formed by a photolithography technique. Therefore, patterns in conformity with a photomask cannot be formed on the substrate 100, due to the optical proximity effect (OPE) at the time of exposure. Specifically, the contour of each device region 202 is rounded at corner portions, and is in a curved state.

FIG. 12(A) shows a situation where corner portions $P_1$ and $P_2$ of a U-shaped device region 202 are rounded. The corner portions $P_1$ are the inner corner portions of the U-shape, and the intersection points between the contour of each stripe portion 211 and the contour of the connecting portion 212. The corner portions $P_2$ are the outer corner portions of the U-shape.

FIG. 12(B) shows a situation where corner portions $P_3$ of an H-shaped device region 202 are rounded. Like the corner portions $P_1$, the corner portions $P_3$ are located at the intersection points between the contour of each stripe portion 211 and the contour of the connecting portion 212.

As described above, due to the optical proximity effect at the time of exposure, the corner portions at the intersection points between the contour of each stripe portion 211 and the contour of the connecting portion 212 are rounded in each device region 202, and the contour of each device region 202 is rounded at corner portions, and is in a curved state. This phenomenon is seen where the device regions 202 are designed to have shapes other than U-shapes and H-shapes.

As the corner portions $P_1$ and $P_2$ of the U-shaped device regions 202 are rounded, electric field concentration can be alleviated, and leakage current can be reduced. Likewise, as the corner portions $P_3$ of the H-shaped device regions 202 are rounded, electric field concentration can be alleviated, and leakage current can be reduced.

As described above, stripe portions 211 are connected to each other by one connecting portion 212 to form a device region 202 in the sense amplifiers 20 in this embodiment. With this arrangement, those stripe portions 211 can be connected to the source line, without the use of a gate electrode 206. As a result, the number of interconnects 208 placed in the sense amplifiers 20 can be reduced by reducing the number of interconnects 208 for connecting the stripe portions 211 to the source line.

In this embodiment, a protruding portion 213 may also be connected to a stripe portion 211 to form a device region 202 in the sense amplifiers 20. In this case, the number of interconnects 208 placed in the sense amplifiers 20 can be reduced, as in a case where stripe portions 211 are connected to each other by a connecting portion 212.

This embodiment may also be applied to device regions in peripheral circuit parts other than the sense amplifiers 20.

As described, embodiments described herein can provide a nonvolatile semiconductor memory device that can reduce the number of interconnects placed in the peripheral circuit parts.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory device comprising:
    a substrate provided with a memory cell part and sense amplifiers on a surface of the substrate;
    first isolation regions and first device regions disposed in the substrate under the memory cell part;
    second isolation regions and second device regions disposed in the substrate under the sense amplifiers;

memory cell transistors placed in the memory cell part, each of which includes a tunnel insulator and a charge storage layer successively disposed on one of the first device regions;

peripheral transistors placed in the sense amplifiers, each of which includes a gate insulator and a gate electrode successively disposed on one of the second device regions;

a plurality of interconnects disposed on the substrate in the sense amplifiers, extending in a first direction parallel to the surface of the substrate, being adjacent to one another in a second direction perpendicular to the first direction, and arranged in a same interconnect layer; and a plurality of bit lines disposed on the substrate in the memory cell part, extending in the first direction, being adjacent to one another in the second direction, and electrically connecting the memory cell part and the sense amplifiers, at least one of the second device regions comprising:

first and second stripe portions extending in the first direction, being adjacent in the second direction, and having stripe shapes; and a connecting portion disposed to connect the first stripe portion and the second stripe portion, the device further comprising a source contact disposed on the connecting portion, and electrically connected to one of the interconnects.

2. The device according to claim 1, at least one of the gate electrodes of the peripheral transistors comprises a first portion disposed on one of the second device regions, and a second portion disposed on one of the second isolation regions, and the device further comprises:

a first gate contact disposed on the first portion, and electrically connected to one of the interconnects; and a second gate contact disposed on the second portion, and electrically connected to one of the interconnects.

3. The device according to claim 2, wherein the at least one of the gate electrodes is continuously disposed on the first and second stripe portions which are connected to each other by the connecting portion.

4. The device according to claim 2, wherein the at least one of the gate electrodes is continuously disposed on the first and second stripe portions which are separated from each other by one of the second isolation regions.

5. The device according to claim 1, wherein at least two of the second device regions each comprises the first and second stripe portions and the connecting portion connected to each other, a planar shape of each of the at least two of the second device regions is a U-shape or H-shape, and the U-shaped second device regions and the H-shaped second device regions are alternately arranged along the second direction in the substrate.

6. The device according to claim 5, wherein the U-shaped second device regions include:

right U-shaped second device regions, each of whose planar shape is a U-shape when seen from a positive direction of the first direction; and inverted U-shaped second device regions, each of whose planar shape is a U-shape when seen from a negative direction of the first direction.

7. The device according to claim 6, wherein the right U-shaped second device regions and the inverted U-shaped second device regions are alternately arranged along the second direction via the H-shaped second device regions in the substrate.

8. The device according to claim 1, wherein at least two of the second device regions each comprises the first and second stripe portions and the connecting portion connected to each other, each of the first and second stripe portions has a first width, the first and second stripe portions are arranged at a first interval in the second direction, each of the interconnects has a second width, and the first width is greater than the second width.

9. The device according to claim 8, wherein the first interval is greater than the second width.

10. The device according to claim 8, wherein an interval between adjacent second device regions separated by a second isolation region is greater than the second width.

11. The device according to claim 8, wherein the first width is substantially equal to the first interval.

12. The device according to claim 1, wherein the second device regions are arranged along the first and second directions in the substrate under the sense amplifiers, and the bit lines are arranged so that 4×K bit lines are included in one pitch of the second device regions in the second direction, where K is an integer equal to or greater than one.

13. The device according to claim 12, wherein a planar shape of each of the second device regions is a U-shape or H-shape, and a sequence of the planar shapes of the second device regions in the second direction is repeated with each N second device regions forming one cycle, where N is an integer equal to or greater than two.

14. The device according to claim 1, wherein corners of a contour of each of the second device regions are rounded and the contour is in a curved state, in a planar shape of each of the second device regions.

15. The device according to claim 1, wherein two or more of the interconnects are placed on each of the stripe portions.

16. The device according to claim 1, wherein one or more of the interconnects are placed on each of the connecting portions.

17. The device according to claim 1, wherein one or more of the interconnects are placed on each second isolation region between adjacent second device regions.

18. The device according to claim 1, wherein a length of the first stripe portion in the first direction differs from a length of the second stripe portion in the first direction.

19. The device according to claim 1, wherein the at least one of the second device regions further comprises a protruding portion disposed to protrude from a side face of the first or second stripe portion.

* * * * *